United States Patent
Lee et al.

(10) Patent No.: US 6,319,858 B1
(45) Date of Patent: Nov. 20, 2001

(54) METHODS FOR REDUCING A DIELECTRIC CONSTANT OF A DIELECTRIC FILM AND FOR FORMING A LOW DIELECTRIC CONSTANT POROUS FILM

(75) Inventors: Hong-Ji Lee; David Guang-Kai Jeng, both of Hsinchu (TW)

(73) Assignee: Nano-Architect Research Corporation, Hsinchu (TW)

( * ) Notice: Subject to any disclaimer, the term of this patent is extended or adjusted under 35 U.S.C. 154(b) by 0 days.

(21) Appl. No.: 09/613,318

(22) Filed: Jul. 11, 2000

(51) Int. Cl.⁷ .......................... H01L 21/31; H01L 21/469
(52) U.S. Cl. ........................... 438/787; 438/784; 438/486
(58) Field of Search .................................. 438/787, 784, 438/486, 586

(56) References Cited

U.S. PATENT DOCUMENTS

| | | | |
|---|---|---|---|
| 4,652,467 | * 3/1987 | Brinker et al. | 427/246 |
| 4,987,101 | * 1/1991 | Kanata et al. | 437/228 |
| 5,103,288 | * 4/1992 | Sakamoto et al. | 357/71 |
| 5,158,986 | * 10/1992 | Cha et al. | 521/82 |
| 5,422,377 | * 6/1995 | Aubert | 521/64 |
| 6,008,540 | * 12/1999 | Lu et al. | 257/758 |

* cited by examiner

*Primary Examiner*—Michael Lebentritt
(74) *Attorney, Agent, or Firm*—Thomas, Kayden, Horstemeyer & Risley, LLP

(57) ABSTRACT

Disclosed is a non-solvent method for reducing a dielectric constant of a dielectric film. The dielectric film, which can be formed on a substrate by a spin-on coating or a chemical vapor deposition (CVD), is placed in an atmosphere of an inert gas at a high pressure or in a supercritical fluid state, and then the pressure of the atmosphere is rapidly released to form nanopores on the surface of the dielectric film, whereby the dielectric constant thereof is reduced.

29 Claims, 2 Drawing Sheets

US 6,319,858 B1

METHODS FOR REDUCING A DIELECTRIC CONSTANT OF A DIELECTRIC FILM AND FOR FORMING A LOW DIELECTRIC CONSTANT POROUS FILM

FIELD OF THE INVENTION

The present invention relates generally to the fabrication of a dielectric layer with reduced dielectric constant, and more specifically to a method for producing a low dielectric constant porous film. The porous dielectric layer of the present invention is particularly useful with integrated circuit structures and devices.

BACKGROUND OF THE INVENTION

Regarding to the more complicated ULSI devices and the multiple metallizations, it is no longer suitable to isolate metal wires with the most frequently used dielectric material, i.e., silicon dioxide ($SiO_2$) which has a dielectric constant around 4.1–4.5, since capacitance between two adjacent wires is increased as the distance therebetween is decreased. As shown in the following equation:

$$C = k e_0 A/d,$$

where k is dielectric constant, $e_0$ is vacuum dielectric constant, A. is area and d is distance between two conductors. When the dielectric is maintained constant, the capacitance is increased as the distance d is decreased, which will increase the RC delay time, where R is metal wire resistance and C is capacitance, such that the transmission speed between devices is attenuated. Therefore, to cope with the problem derived from scale down of a chip circuit, it is desired low dielectric constant (k<4.1) materials to control capacitances. The low dielectric constant materials are used for electric isolation between conductors, crosstalk depression and coupling capacitance reduction, thereby shortening RC delay time, enhancing transmission speed and improving coupling noise. There are some organic and inorganic materials to reduce the dielectric constant. Of course, the ideal minimum dielectric constant is 1.0, which is the dielectric constant of air; it is therefore to improve the dielectric constant toward 1.0 in the existing researches. In view of chemical attributes of materials, they can be classified into inorganic low dielectrics and organic low dielectrics. Chemical vapor deposition (CVD) is generally used for the growth of the inorganic materials, such as silicon dioxide doped with fluorine, carbon or hydrogen. Since the manufacturing equipment therefore is similar to the existing production equipment, they have been developed rapidly. The material of a more lower dielectric constant, such as lower than 2, can be obtained with a porous structure formed by either evaporation of a filming solvent or dissolution of a dopant in a film. Porous low dielectrics are highly expected.

U.S. Pat. Nos. 5,470,802, 5,494,858, 5,103,288, 5,548,159, 5,561,318, 5,569,058, 5,661,344, 5,747,880, 5,750,415 and 5,804,508 disclose similar processes for manufacturing porous materials. Namely, pores are formed under the control of volatility of various solvents in a film. In U.S. Pat. No. 5,494,858, for example, a mixture of tetraethylorthosilicate (TEOS), $C_2H_5OH$, $H_2O$, HCl and $NH_4OH$ is prepared to form a gel film onto a wafer by spin-on coating. Gelation and aging may be accomplished by letting the wafer applied with a gel film sit in a saturated ethanol atmosphere for 24 hours at 37° C. After aging is completed, pressure variation is utilized to remove the solvents in the film to form a porous film. The operational pressure can be either smaller than 1 atm to convert liquid state of the solvents into vapor state and thus to leave the porous film or a high pressure for the solvents to approach supercritical state or to be under supercritical conditions to compress the solvents into gases and thus to be moved. Care should be taken in these steps in order to avoid over shrinkage effect to the films. The porosity, diameter and distribution of the pores on the films depend on the reaction condition and the solvent kind. When the porosity is 80%, the dielectric constant is approximately smaller than 1.5. Since the surface adhesion and the heat resist performances are worse as the porosity is larger, a porous film is coated at either side with a layer of adhesive, such as $SiO_2$, to improve adhesion and prevents material in the pores from absorbing water or atom migration.

In addition to the method in which solvent evaporation is used for manufacturing a porous film, a method of forming pores by removing a dopant in a film is known. Such as in U.S. Pat. No. 5,744,399, $C_{60}$ or $C_{70}$ fullerene is doped into a $SiO_2$ film during the $SiO_2$ film is formed, and then $C_{60}$ is dissolved by a solvent or oxidized by $O_2$ and/or $O_3$ plasma to form pores.

In U.S. Pat. No. 5,785,787, materials such as anthroquinone and low melting temperature waxes, which are UV light degradable or sublimable, are used as dopants of a polytetrafluoroethylene (PTFE) film. The resultant PTFE film with 70% porosity reduces the dielectric constant from 1.9 to 1.2. Naturally, both sides of such a porous structure need adhesive layers; otherwise, it would peel off easily.

The methods of manufacturing a low dielectric constant porous film suitable to semiconductor processes can be categorized into two types such as shown above, i.e., solvent evaporation and removal of a dopant in a film. The former causes problems of shrinkage effect and poor adhesion to a substrate, while the latter causes problems of infiltration of residual dopant in the film at the subsequent processes. In view of these problems, herein, a non-solvent method of producing a low dielectric constant porous film is proposed.

SUMMARY OF THE INVENTION

An object of the present invention is to provide a non-solvent method of producing a low dielectric constant porous film. The problems for the conventional art, such as residual organic solvent, dopant migration, low adhesion with the porous film, and shrinkage due to solvent evaporation, are to be solved according to this method of the present invention. The method comprises a high-pressure treatment to the dielectric film to be formed with pores on its surface by an introduction of an inert gas at a high pressure close to or exceeding a critical pressure of the inert gas into a reaction chamber in which the dielectric film is placed and then a release of the pressure in the chamber applied at a rate. The "inert gas" called in this invention means the gas that is not reactive with the dielectric film. The film growth and the high-pressure treatment process can be repeated until the dielectric film with the pores thereof reaches a desired thickness.

BRIEF DESCRIPTION OF THE DRAWINGS

This and other objects, features and advantages of the present invention will become apparent to those skilled in the art upon consideration of the following description of the preferred embodiments of the present invention taken in conjunction with the accompanying drawings, in which:

FIG. 1b is the sectional views of a semiconductor substrate in the respective steps as shown in FIG. 1a.

DETAILED DESCRIPTION

Figure 1B:
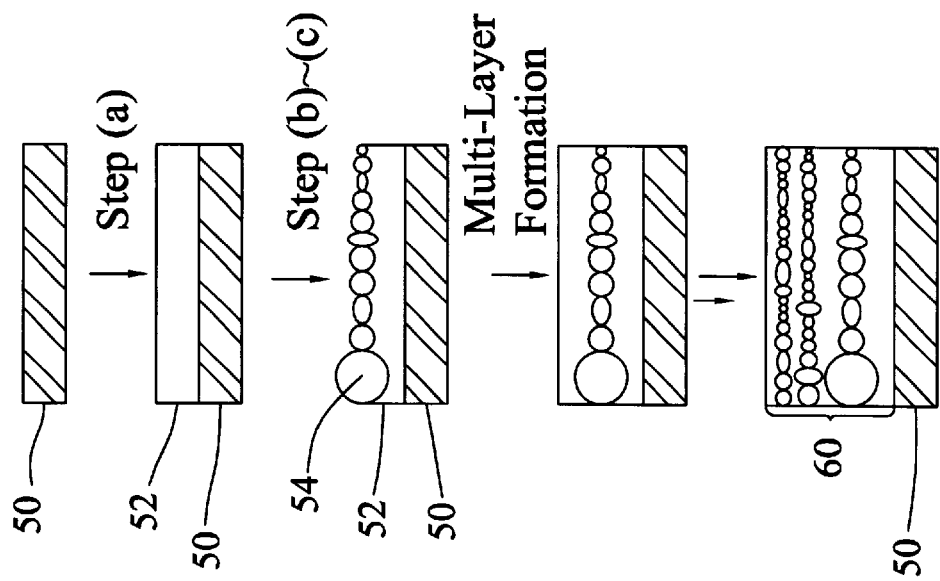
Figure 1A:
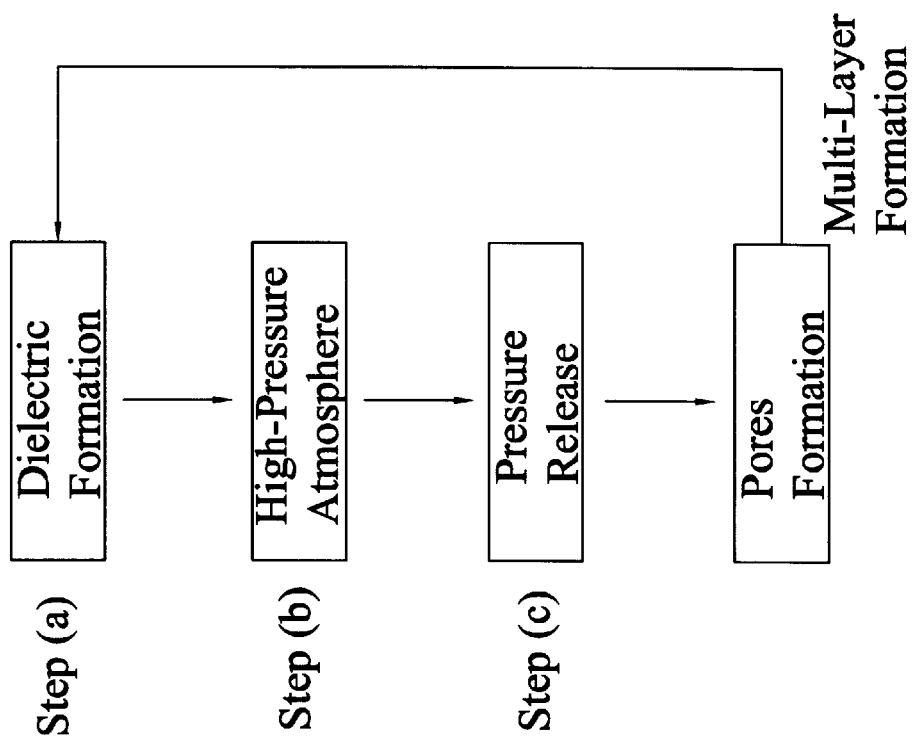
FIG. 1a is a flow chart of the primary steps (a) to (c) for a non-solvent method to produce low dielectric constant porous films according to the present invention.

FIG. 1a is a flow chart of the primary steps (a) to (c) for a non-solvent method to produce low dielectric constant porous films according to the present invention, while the sectional views of a semiconductor substrate 50 in the respective steps as in FIG. 1a are shown in FIG. 1b. In step (a), on a semiconductor substrate 50 is formed with a dielectric film 52, such as a low dielectric constant organic polymeric film that is formed by a process of spin-on coating and a low dielectric constant inorganic film that is deposited by a method of chemical vapor deposition (CVD). In step (b), the semiconductor substrate 50 with the dielectric film 52 is placed in a high-pressure chamber where an inert gas at a high pressure or in a supercritical state is introduced, in which the high-pressure inert gas or the supercritical fluid of the inert gas would permeate into the dielectric film 52. After a time duration, a rapid release of the pressure in the high-pressure chamber is applied to form pores 54 on the dielectric film 52. Due to the permeability of the high-pressure inert gas or the supercritical fluid of the inert gas, the pores 54 are consecutively and densely formed on the surface of the dielectric film 52 without destroying the adhesion between the dielectric film 52 and the substrate 50. If a more porosity of the dielectric film is needed, steps (a) to (c) are repeated until the dielectric film 60 has a desired thickness.

In principle, the inert gas is chosen to have the property not reactive with the dielectric film 52. For instance, carbon dioxide ($CO_2$: $T_c$=31.1° C., $P_c$=1070 psi), nitrogen ($N_2$: $T_c$=−147° C., $P_c$=491.7 psi), helium (He: $T_c$=−269.9° C., $P_c$=16.53 psi), argon (Ar: $T_c$=−122.4° C., $P_c$=706.3 psi), ethane ($C_2H_6$: $T_c$=−32.2° C., $P_c$=708.3 psi), propane ($C_3H_8$: $T_c$=96.7° C., $P_c$=615.8 psi), ethylene ($C_2H_4$: $T_c$=9.9° C., $P_c$=742.1 psi), propylene ($C_3H_6$: $T_c$=91.9° C., $P_c$=667.2 psi), and the like or the mixtures of these gases are suitable for the inert gas.

According to the present invention, with the diffusion of the inert gas into the dielectric film and then the rapid release of the pressure in the chamber, preferably at a pressure reduction rate between 5 psi/sec and 110 psi/sec, the pores are formed on the dielectric film 52 resulted from the suddenly expansion of the high-pressure inert gas due to the rapid pressure reduction. Such a way to form the pores 54 with the energy produced by entropy change ($\Delta S$) provides several advantages. First, there will be no solvent contaminations occurred when the porous dielectric film 60 is formed by the use of a dense gas at a high pressure or in a supercritical state. Further, the operational conditions and the complicated processes of the film gelation, aging and solvent evaporation are simplified with the present invention in comparison with a traditional sol-gel method of producing a low dielectric constant porous film. Contrary to the prior art, the adhesion between the bottom of the dielectric film 60 and the substrate 50 will not be destroyed since the pores 54 are consecutively and densely formed only on the surface of the low dielectric constant porous film 60 of the present invention. In addition, a desired porosity can be obtained by a growth of a film in a corresponding thickness in accordance with the diameter of the pores in advance and then a repeated processes of high-pressure treatment, rapid release of pressure and film growth till a desired thickness is reached, as described in FIG. 1. The problems resulted from the shrinkage due to solvent evaporation and the infiltration of a dopant out of a film in the subsequent processes can be avoided.

In the present invention, the dielectric film can be of a low dielectric constant inorganic material, such as SiOF, α-CF and SiOC, deposited by a CVD method or a low dielectric constant organic polymer, such as polyimide and polytetrafluoroethylene (PTFE), formed by a spin-on coating. For an illustration of the superior capability of surface pore production of the present invention, a low dielectric film of Si—O—C—F obtained from the gases of $SiH_4$, $N_2O$ and $CF_4$ deposited by a CVD method is adopted in the following embodiments.

According to the high-pressure treatment to the film in the present invention, different pressure release rates result in different pore diameter distributions. The larger the pressure release rate is given, the more the ratio of larger-diameter pores appears. A preferred pore size of a diameter in a range of 5 nm to 20 nm can be obtained by a proper control of the pressure release rate.

The method of high-pressure, non-solvent pore production proposed by the present invention is suitable to the existing various low dielectric constant (k<4.1) films. In the case of a Si—O—C—F film of 2000 angstroms in thickness, the pores under an argon supercritical condition have a diameter in a range of from 5 nm to 80 nm, dominantly from 5 nm to 50 nm, and preferably from 5 nm to 20 nm. The dielectric constant k after the high-pressure processing is decreased to be 2.2–2.6 from the original value of about 2.5–2.8, and can be further decreased if the porosity is increased.

Figure 2:
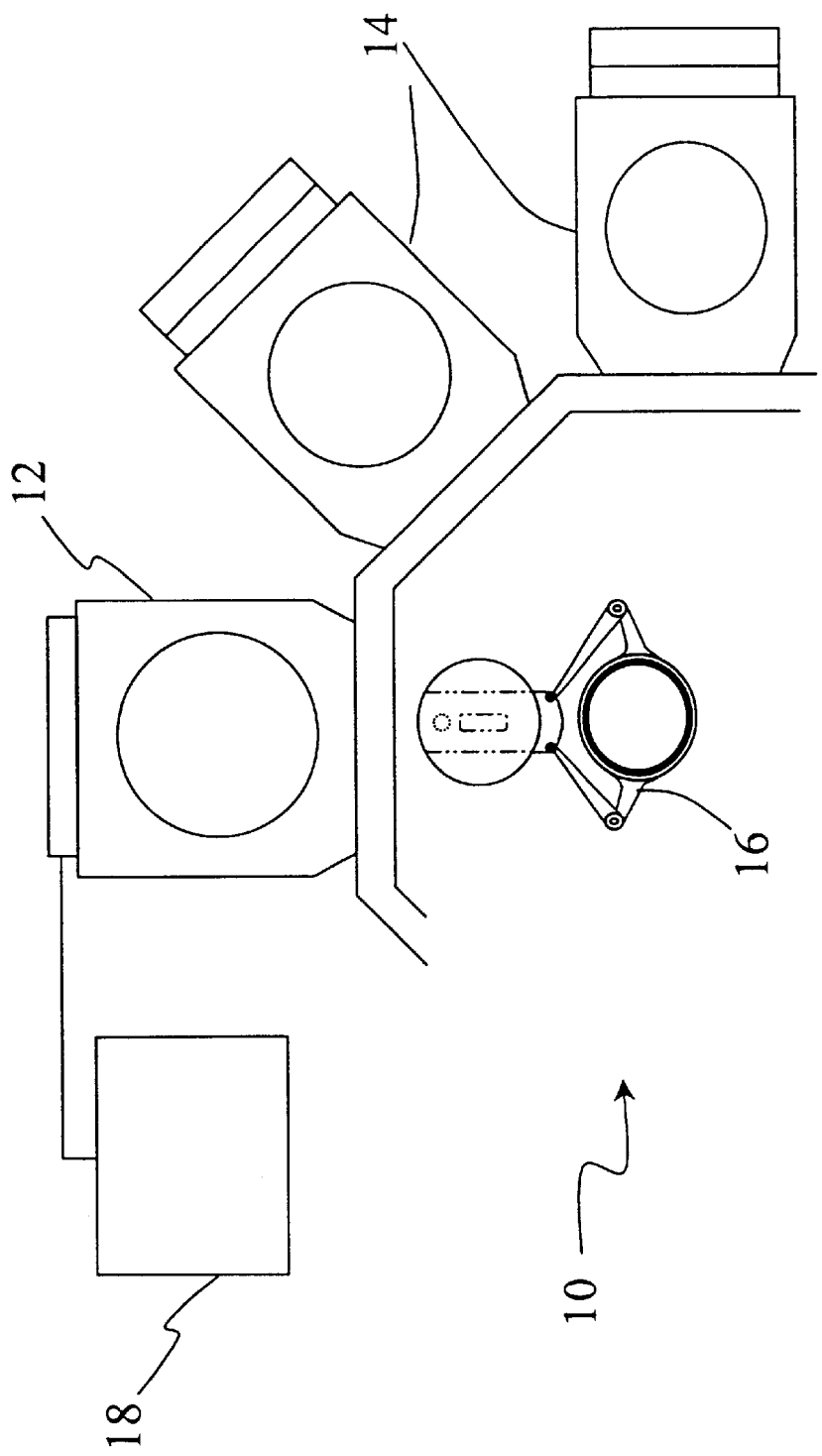
FIG. 2 is a view to show a multi-chamber cluster tool system 10 to implement the method of the present invention.

FIG. 2 is a view to show a multi-chamber cluster tool system 10 to implement the method of the present invention, in which are a pressure chamber 18 for the storage of an inert gas at a high pressure, a high-pressure processing chamber 12 linked to the pressure chamber 18, and chambers 14 connected to a wafer handling system to have the process of CVD or etching. A robot 16 is adapted to simplify the delivery of semiconductor wafers.

The present invention can be further appreciated by means of the following embodiments that are exemplary rather than restrictive.

[Embodiment 1]

An air compressor is activated to pressurize and store highly pure argon gas in a pressure chamber with a pressure set to be 2500 psi. A wafer coated with a Si—O—C—F dielectric film of 2000 angstroms in thickness by a CVD method is placed in a stainless pressure chamber of 1-liter volume and of 10000-psi withstanding pressure, which is then heated up to 40° C. and followed with an introduction of the argon stored in the pressure chamber to maintain the reaction chamber at a pressure of 1000 psi. After 15 minutes, the pressure in the reaction chamber is released at a rate of 60 psi per second to produce on the dielectric film with pores in diameter ranged from 5 nm to 70 nm, and dominantly from 5 nm to 40 nm.

[Embodiment 2]

The reaction procedures are the same as those in Embodiment 1 under the conditions of 1000-psi reaction pressure, 40° C. temperature, 30-minutes reaction time and 60-psi/sec pressure release rate. The pores obtained on the dielectric film have a diameter in a range of between 5 nm and 80 nm, and dominantly between 5 nm and 60 nm.

[Embodiment 3]

The reaction procedures are the same as those in Embodiment 1 under the conditions of 1600-psi reaction pressure, 40° C. temperature, 30-minutes reaction time and 15-psi/sec pressure release rate. The pores formed on the dielectric film have a diameter in a range of from 5 nm to 70 nm, and dominantly from 5 nm to 50 nm.

[Embodiment 4]

The reaction procedures are the same as those in Embodiment 1 under the conditions of 1600-psi reaction pressure, 40° C. temperature, 30-minutes reaction time and 30-psi/sec pressure release rate. The pores on the dielectric film are given in diameter ranged from 5 nm to 80 nm, and dominantly from 5 nm to 60 nm.

[Embodiment 5]

The reaction procedures are the same as those in Embodiment 1 under the conditions of 1600-psi reaction pressure, 40° C. temperature, 30-minutes reaction time and 60-psi/sec pressure release rate. Pore diameters obtained are from 5 nm to 90 nm, and dominantly from 10 nm to 60 nm.

[Embodiment 6]

The reaction procedures are the same as those in Embodiment 1 under the conditions of 1300-psi reaction pressure, 40° C. temperature, 30-minutes reaction time and 30-psi/sec pressure release rate. Pores have a diameter in a range of from 5 nm to 80 nm, and dominantly from 5 nm to 50 nm.

[Embodiment 7]

The reaction procedures are the same as those in Embodiment 1 under the conditions of 1300-psi reaction pressure, 40° C. temperature, 15-minutes reaction time and 30-psi/sec pressure release rate. Pore diameters obtained are from 5 nm to 80 nm, and dominantly from 5 nm to 40 nm.

[Embodiment 8]

The reaction procedures are the same as those in Embodiment 1 under the conditions of 1300-psi reaction pressure, 40° C. temperature, 15-minutes reaction time and 60-psi/sec pressure release rate. Pores are obtained in diameter of from 5 nm to 80 nm, and dominantly from 5 nm to 50 nm.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A non-solvent method for reducing a dielectric constant of a non-solvent dielectric film, comprising the steps of:
   (a) placing the solvent-free dielectric film in an atmosphere of an inert gas at a high pressure; and
   (b) making the pressure of the atmosphere of the inert gas rapidly released to form pores on the solvent-free dielectric film.

2. The method according to claim 1, wherein the inert gas has a property not reactive with the dielectric film.

3. The method according to claim 1, wherein the inert gas comprises a material selected from the group consisting of $CO_2$, $N_2$, He, Ar, $C_2H_6$, $C_3H_8$, $C_2H_4$, $C_3H_6$, and the mixtures thereof.

4. The method according to claim 1, wherein the dielectric film comprises a low dielectric constant inorganic material deposited by a chemical vapor deposition (CVD).

5. The method according to claim 4, wherein the dielectric film comprises a low dielectric constant inorganic material selected from the group consisting of SiOF, α-CF, SiOC, and the like.

6. The method according to claim 1, wherein the dielectric film comprises a low dielectric constant organic polymer formed by a spin-on coating.

7. The method according to claim 6, wherein the dielectric film comprises a low dielectric constant organic polymer selected from the group consisting of polyimide, polytetrafluoroethylene (PTFE), and the like.

8. The method according to claim 1, wherein the atmosphere of the inert gas has a pressure close to or exceeding a critical pressure of the inert gas.

9. The method according to claim 8, wherein the atmosphere of the inert gas has a temperature close to or exceeding a critical temperature of the inert gas.

10. The method according to claim 8, wherein the atmosphere of the inert gas comprises the inert gas in a supercritical fluid state.

11. The method according to claim 1, wherein the pressure of the atmosphere of the inert gas is reduced at a rate of between 5 psi/sec and 110 psi/sec in the step (b).

12. The method according to claim 1, wherein the pores have a diameter in a range of between 5 nm and 80 nm.

13. The method according to claim 12, wherein the pores have a diameter in a range of between 5 nm and 50 nm.

14. The method according to claim 1, further comprising the steps (a) and (b) in repeat with n times, where n is an integer not smaller than 1.

15. A non-solvent method for producing a low dielectric constant porous film, comprising the steps of:
   (a) forming a solvent-free dielectric film on a semiconductor substrate;
   (b) placing the semiconductor substrate with the solvent-free dialectic film in an atmosphere of an inert gas at a high pressure; and
   (c) making the pressure of the atmosphere of the inert gas rapidly released to form pores on the solvent-free dielectric film.

16. The method according to claim 15, further comprising the steps (a) to (c) in repeat until the dielectric film has a selected thickness.

17. The method according to claim 15, wherein the semiconductor substrate with the dielectric film is placed in a high-pressure chamber and the inert gas is introduced into the high-pressure chamber in the step (b).

18. The method according to claim 15, wherein the inert gas has a property not reactive with the dielectric film.

19. The method according to claim 15, wherein the inert gas comprises a material selected from the group consisting of $CO_2$, $N_2$, He, Ar, $C_2H_6$, $C_3H_8$, $C_2H_4$, $C_3H_6$, and the mixtures thereof.

20. The method according to claim 15, wherein the dielectric film comprises a low dielectric constant inorganic material deposited by a chemical vapor deposition (CVD).

21. The method according to claim 20, wherein the dielectric film comprises a low dielectric constant inorganic material selected from the group consisting of SiOF, α-CF, SiOC, and the like.

22. The method according to claim 15, wherein the dielectric film comprises a low dielectric constant organic polymer formed by a spin-on coating.

23. The method according to claim 22, wherein the dielectric film comprises a low dielectric constant organic polymer selected from the group consisting of polyimide, polytetrafluoroethylene (PTFE), and the like.

24. The method according to claim 15, wherein the atmosphere of the inert gas has a pressure close to or exceeding a critical pressure of the inert gas.

25. The method according to claim 24, wherein the atmosphere of the inert gas has a temperature close to or exceeding a critical temperature of the inert gas.

26. The method according to claim 24, wherein the atmosphere of the inert gas comprises the inert gas in a supercritical fluid state.

27. The method according to claim 15, wherein the pressure of the atmosphere of the inert gas is reduced at a rate of between 5 psi/sec and 110 psi/sec in the step (c).

28. The method according to claim 15, wherein the pores have a diameter in a range of between 5 nm and 80 nm.

29. The method according to claim 28, wherein the pores have a diameter in a range of between 5 nm and 50 nm.

* * * * *